(12) United States Patent
Nakamura

(10) Patent No.: US 12,666,923 B2
(45) Date of Patent: Jun. 23, 2026

(54) CHIP TREATING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 338 days.

(21) Appl. No.: 18/354,051

(22) Filed: Jul. 18, 2023

(65) Prior Publication Data

US 2024/0047262 A1     Feb. 8, 2024

(30) Foreign Application Priority Data

Aug. 2, 2022     (JP) .................................. 2022-123301

(51) Int. Cl.

| | |
|---|---|
| *H10P 72/70* | (2026.01) |
| *B24B 7/22* | (2006.01) |
| *B24B 9/06* | (2006.01) |
| *B24B 27/06* | (2006.01) |
| *B24B 37/00* | (2012.01) |

(Continued)

(52) U.S. Cl.

CPC .......... *H10P 72/7402* (2026.01); *B24B 7/228* (2013.01); *B24B 9/065* (2013.01); *B24B 27/06* (2013.01); *B24B 37/00* (2013.01); *B24B 37/02* (2013.01); *B24B 37/04* (2013.01); *B24B 41/06* (2013.01); *H10P 52/00* (2026.01); *H10P 54/00* (2026.01); *H10P 72/7416* (2026.01)

(58) Field of Classification Search

CPC .......... B24B 7/288; B24B 7/04; B24B 27/06; B24B 27/0076; B24B 27/0069; B24B 27/0046; B24B 37/00; B24B 37/005; B24B 37/013; B24B 37/02; B24B 37/04; B24B 37/042; B24B 37/07; B24B 37/10; B24B 37/105; B24B 37/107; B24B 37/30;

B24B 37/34; B24B 37/12; B24B 9/065; B24B 41/005; B24B 41/06; B24B 41/068; B24B 41/061; B24B 47/22; B24B 49/02; B24B 49/04; H01L 21/304; H01L 21/67132; H01L 21/6836; H01L 21/78; H01L 2221/68381; H01L 2221/68327; H01L 2221/6834; H01L 2221/68386; H01L 2221/68304; H01L 2221/68313; H01L 2221/68318; H01L 2221/68322; B23K 26/38; H10P 72/7402; H10P 72/7416; H10P 72/7422; H10P 72/744; H10P 72/7442; H10P 52/00; H10P 54/00

USPC .......................................................... 451/41
See application file for complete search history.

(56) References Cited

U.S. PATENT DOCUMENTS

| | | | |
|---|---|---|---|
| 2003/0131929 A1* | 7/2003 | Yamamoto .......... | H01L 21/6836 156/510 |
| 2012/0064696 A1* | 3/2012 | Hirosawa .......... | H01L 21/67132 257/E21.599 |

FOREIGN PATENT DOCUMENTS

| | | | |
|---|---|---|---|
| JP | 2001351890 A | * | 12/2001 |
| JP | 2004327587 A | | 11/2004 |
| JP | 5558300 B2 | * | 7/2014 |

OTHER PUBLICATIONS

Office Action issued in counterpart Japanese patent application No. 2022423301, dated Mar. 10, 2026.

* cited by examiner

*Primary Examiner* — Michael A Gump
(74) *Attorney, Agent, or Firm* — Greer Burns & Crain Ltd.

(57) ABSTRACT

A chip treating method includes a first tape affixing step of affixing a first tape to a circular wafer, a ring frame unit forming step of removing a central part of the wafer to form
(Continued)

a ring frame unit having an opening, and a chip disposing step of disposing chips on the first tape exposed in the opening.

9 Claims, 6 Drawing Sheets

(51) Int. Cl.
  *B24B 37/02*          (2012.01)
  *B24B 37/04*          (2012.01)
  *B24B 41/06*          (2012.01)
  *H10P 52/00*          (2026.01)
  *H10P 54/00*          (2026.01)

CHIP TREATING METHOD

BACKGROUND OF THE INVENTION

Field of the Invention

The present invention relates to a chip treating method of disposing chips in an opening of a ring frame having the opening in its center, through a tape.

Description of the Related Art

A wafer formed on a front surface thereof with a plurality of devices such as integrated circuits (ICs) and large scale integration (LSI) circuits in the state of being partitioned by a plurality of intersecting streets is ground on the back surface to be thinned to a desired thickness, and is thereafter divided into individual device chips by a dicing apparatus or a laser processing apparatus. The thus divided device chips are used for electric apparatuses such as mobile phones and personal computers.

In addition, the present applicant has proposed a technology in which, after a wafer is divided into individual device chips, the plurality of device chips are disposed on a tape exposed in an opening of a ring frame having the opening in its center, and the back surfaces of the device chips are individually ground (see Japanese Patent Laid-open No. 2001-351890).

SUMMARY OF THE INVENTION

When the tape is affixed to the ring frame having the opening in its center, in order to carry out the technology described in Japanese Patent Laid-open No. 2001-351890, there may arise a problem that twisting of the tape occurs at the opening, so that the device chips cannot be held suitably, making it difficult to suitably process the back surfaces of the device chips.

Accordingly, it is an object of the present invention to provide a chip treating method by which it is possible to prevent occurrence of twisting of a tape at an opening, in disposing chips in the opening of a ring frame having the opening in its center, through the tape.

In accordance with an aspect of the present invention, there is provided a chip treating method of disposing a chip in an opening of a ring frame having the opening in its center, through a tape, the chip treating method including a first tape affixing step of affixing a first tape to a wafer, a ring frame unit forming step of removing a central part of the wafer to form a ring frame unit having the opening, and a chip disposing step of disposing the chip on the first tape exposed in the opening of the ring frame unit.

Preferably, the chip treating method further includes, after the chip disposing step, a second tape affixing step of affixing a second tape on a side where the chip is disposed, in such a manner as to cover the ring frame, thereby clamping the ring frame between the first tape and the second tape in a sandwiching manner, and a chip transferring step of peeling off the first tape to transferring the chip onto the second tape.

Preferably, a blank material of the wafer and a blank material of the chip are the same. In addition, preferably, in the ring frame unit forming step, a cutting blade or a laser beam is positioned along an outline of the opening to be formed, and the outline is cut to form the opening. Preferably, the chip treating method further includes a processing step of processing the chip, after the chip disposing step.

Preferably, the processing step is a step of carrying out a grinding process of grinding the chip.

Preferably, the chip treating method further includes a processing step of processing the chip, after the chip transferring step. The processing step is a step of carrying out a grinding process of grinding the chip.

According to the chip treating method of the present invention, it is possible to prevent generation of twisting of the tape at the opening, in disposing the chip in the opening of the ring frame having the opening in its center, through the tape.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A chip treating method according to preferred embodiments of the present invention will be described in detail below with reference to the attached drawings.

Figure 1:
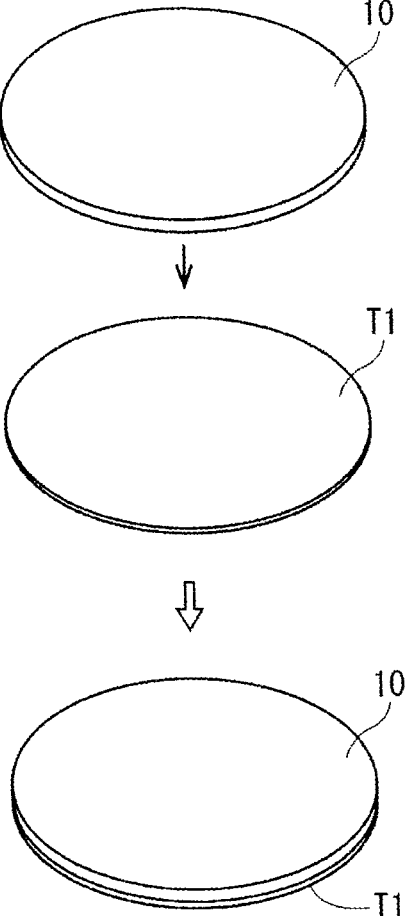
FIG. 1 is a perspective view depicting a first tape affixing step according to an embodiment of the present invention.

In carrying out the chip treating method of the present embodiment, performed is a first tape affixing step in which a circular wafer 10 having no opening as depicted in FIG. 1 is prepared, and a first tape T1 is affixed to a surface on one side of the wafer 10. The wafer 10 is a wafer which is the same as a chip 14 described later in blank material and which is slightly thicker than the chip 14; for example, a wafer of silicon (Si) is prepared. The wafer 10 has no devices or the like formed on a front surface or a back surface thereof. The first tape T1 is formed of, for example, polyolefin resin, and has a pressure sensitive adhesive layer on a front surface thereof.

When the wafer 10 and the first tape T1 are united together as described above, carried out is a ring frame forming step in which a central part of the wafer is removed.

The ring frame forming step will be described specifically with reference to FIGS. 2A to 2C.

Figure 2A:
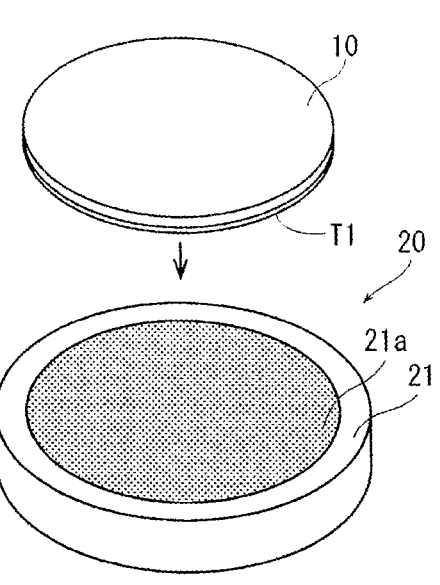
FIG. 2A is a perspective view depicting the manner in which a wafer is mounted on a chuck table in a ring frame unit forming step.
Figure 2B:
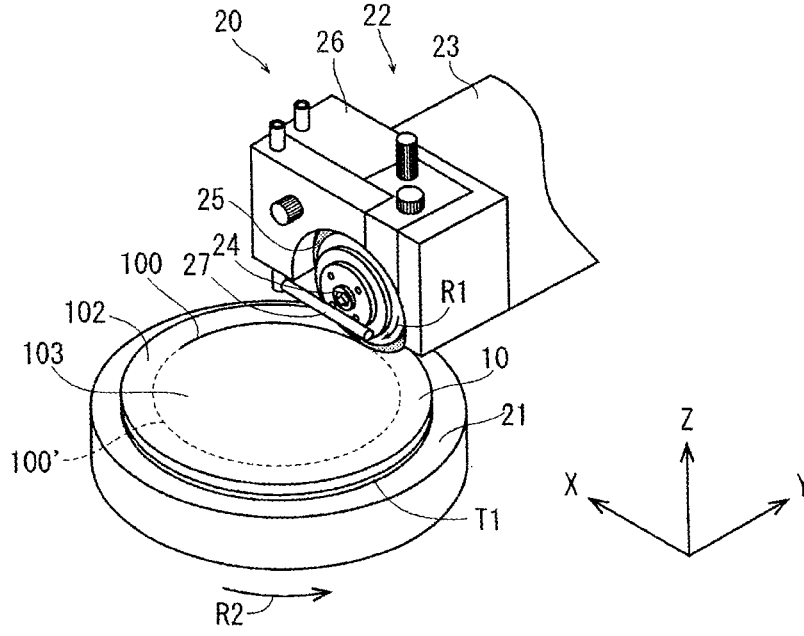
FIG. 2B is a perspective view depicting the manner in which a dividing groove is formed along a circular dividing line of a wafer.
Figure 2C:
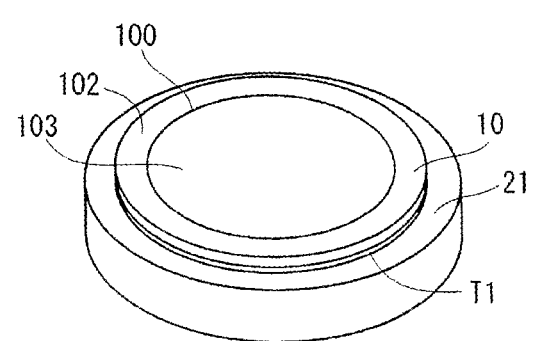
FIG. 2C is a perspective view depicting the manner in which the dividing groove depicted in FIG. 2B is formed.

The method for carrying out the ring frame forming step is not limited to any particular method, and, for example, the method is carried out by a cutting apparatus 20 as depicted in FIGS. 2A and 2B (only a part is depicted).

The cutting apparatus 20 includes a chuck table 21 that has a holding surface 21a and that is configured to be rotatable and a cutting unit 22 that cuts the wafer held under suction by the chuck table 21. The holding surface 21a of the chuck table 21 is connected to an unillustrated suction source. The cutting unit 22 includes a spindle 24 rotatably supported on a spindle housing 23 disposed in a Y-axis direction depicted by an arrow Y in FIG. 2B, an annular cutting blade 25 fixed to a tip of the spindle 24, a blade cover 26 that covers the cutting blade 25, a cutting water supply nozzle 27 for supplying cutting water to a part to be cut by the cutting blade 25, an X-axis moving mechanism for moving the chuck table 21 in an X-axis direction indicated by an arrow X in the figure, and a Y-axis moving mechanism for moving the cutting blade 25 in the Y-axis direction indicated by an arrow Y in the figure (both of the moving mechanisms are unillustrated). The spindle 24 is driven to rotate by an unillustrated spindle motor.

In carrying out the ring frame forming step, first, as depicted in FIG. 2A, the side of the first tape T1 affixed to the wafer 10 is placed on the holding surface 21a of the chuck table 21 while being directed downward, and an unillustrated suction source is operated to hold the wafer 10 under suction. Next, the wafer 10 is imaged by appropriate alignment means, and a circular dividing line 100' (indicated by a broken line) as depicted in FIG. 2B is identified. The dividing line 100' is a line for partitioning a peripheral region 102 forming the ring frame and a central part 103 surrounded by the peripheral region 102, and is a line constituting an outline of the opening to be formed. Information concerning the setting position and the size of the dividing line 100' is stored in advance in an unillustrated controller disposed in the cutting apparatus 20. Subsequently, the X-axis moving mechanism is operated to move the chuck table 21 to a position directly under the above-mentioned cutting unit 22, and the Y-axis moving mechanism is operated to position the cutting blade 25 on the dividing line 100'. Next, the cutting blade 25 is rotated at high speed in the direction indicated by an arrow R1 near the dividing line 100', the cutting blade 25 is made to cut into the wafer from an upper side, and the chuck table 21 is rotated in the direction indicated by an arrow R2. As a result, as depicted in FIG. 2C, a dividing groove 100 cut along the outline of the opening to be formed is formed. Note that the cutting-in depth in this instance is such a cutting-in depth that the wafer 10 is cut but the first tape T1 is not completely cut.

Figure 3:
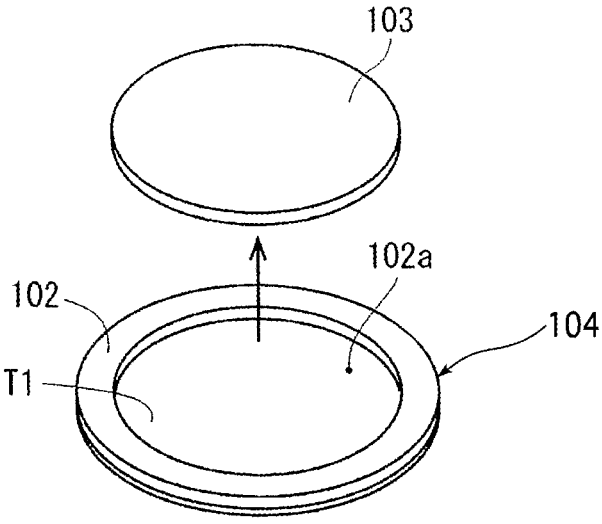
FIG. 3 is a perspective view depicting the manner in which a central part of the wafer is removed.

When the dividing groove 100 has been formed as described above, the wafer 10 is taken out from the chuck table 21, and the central part 103 is peeled off from the first tape T1 affixed to the wafer 10, as depicted in FIG. 3. As a result, only the peripheral region 102 of the wafer 10 is left on the first tape T1, and a ring frame 102 (hereinafter referred to as the "ring frame unit 104") which has the opening 102a in its center and in which the first tape T1 is exposed in the opening 102a is formed.

Note that the method for forming the dividing groove 100 is not limited to the method carried out with use of the above-described cutting apparatus 20; for example, a laser processing apparatus for applying a laser beam of such a wavelength as to be absorbed in the wafer 10 may be used to conduct an ablation process along the dividing line 100', thereby forming the dividing groove 100 for forming the above-mentioned opening 102a.

When the ring frame forming step has been carried out as described above, as depicted in FIG. 4, performed is a chip disposing step in which a plurality of chips 14 (in the embodiment depicted in the figure, four chips) are disposed on the first tape T1 exposed in the opening 102a of the ring frame unit 104. The chips 14 are device chips obtained by dividing an unillustrated silicon wafer formed with devices on a front surface thereof, and are chips which need to be thinned by a grinding process of grinding back surfaces 14b, before being put to use as products. Hence, in disposing the chips 14 on the first tape T1, they are disposed in such a manner that the front surfaces 14a of the chips 14 are directed downward and the back surfaces 14b to be ground are directed upward.

The chip disposing step is conducted by using the ring frame unit 104 formed as described above, and the chips 14 are disposed on the first tape T1, whereby the chips 14 are held by the ring frame unit 104 in a state suitable for being processed to be described below, without the first tape T1 being twisted. Next, the ring frame unit 104 holding the chips 14 thereon is conveyed to a grinding apparatus 30 depicted in FIG. 5B (only a part is depicted).

As illustrated in the figure, the grinding apparatus 30 includes a chuck table 31 having a holding surface 31a and a grinding unit 32. The holding surface 31a of the chuck table 31 is connected to an unillustrated suction source. The grinding unit 32 includes a rotary spindle 33 rotated by an unillustrated rotational drive mechanism, a wheel mount 34 mounted to a lower end of the rotary spindle 33, and a grinding wheel 35 attached to a lower surface of the wheel mount 34, and a plurality of grindstones 36 are arranged in an annular pattern on a lower surface of the grinding wheel 35.

Figures 5A, 5B:
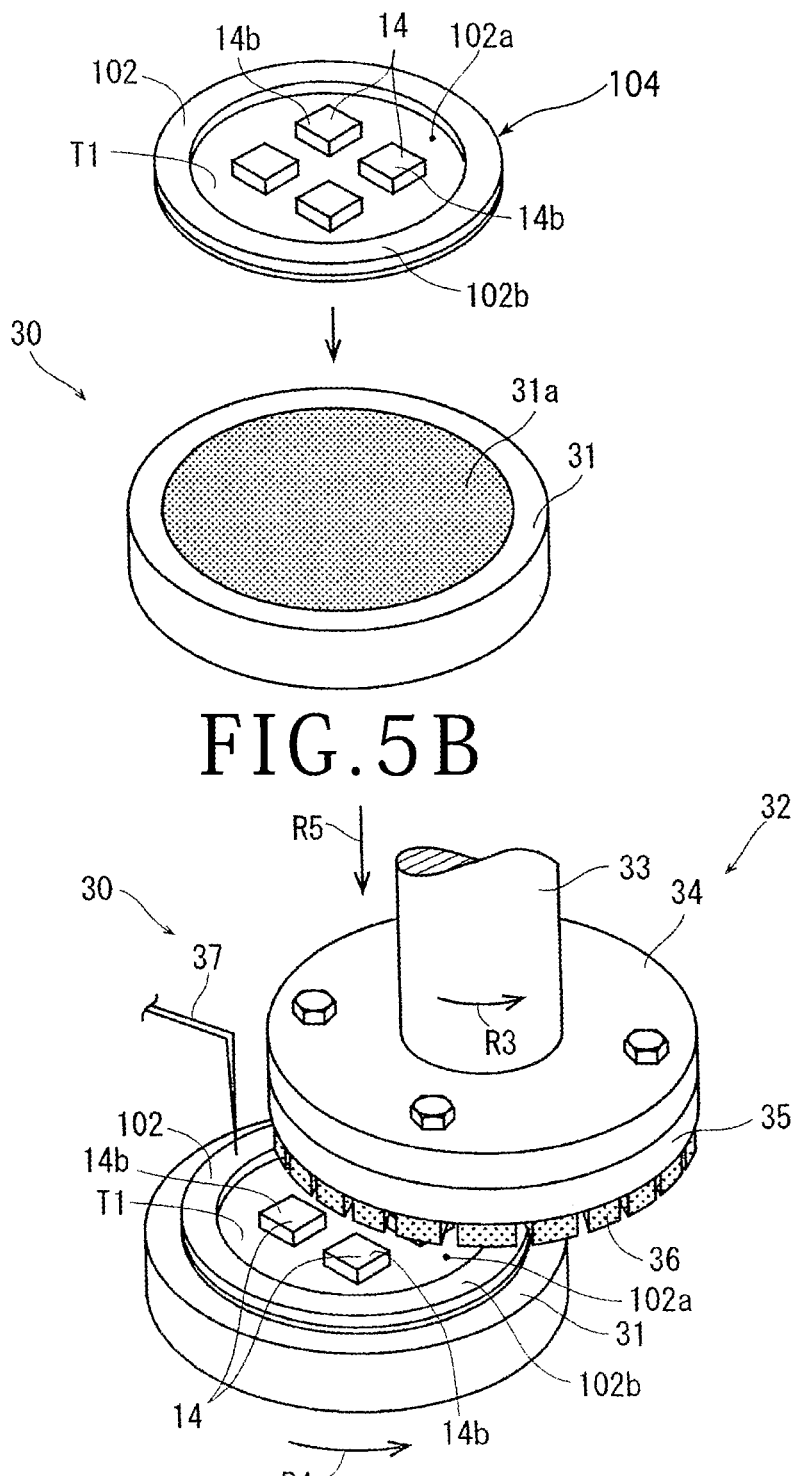
FIG. 5A is a perspective view depicting a processing step of processing chips according to an embodiment.
FIG. 5B is a perspective view illustrating a part of a grinding apparatus.

When the ring frame unit 104 has been conveyed to the grinding apparatus 30 and the first tape T1 side has been mounted on the holding surface 31a of the chuck table 31 and held under suction by the holding surface 31a, the chuck table 31 is positioned directly under the grinding unit 32, and, while the rotary spindle 33 of the grinding unit 32 is rotated in the direction indicated by an arrow R3 in FIG. 5B at, for example, 6,000 rpm, the chuck table 31 is rotated in the direction indicated by an arrow R4 at, for example, 300 rpm. Then, by unillustrated grinding water supply means, grinding water is supplied onto the front surface 102b of the ring frame unit 104 and the back surfaces 14b of the chips 14, and, in this state, the grinding unit 32 is lowered in the direction indicated by an arrow R5, to bring the grindstones 36 into contact with the front surface 102b of the ring frame unit 104, and the grinding wheel 35 is put into downward grinding feeding at a grinding feed speed of, for example, 1 μm/sec.

In this instance, grinding can be proceeded while the thickness of the ring frame unit 104 is measured by thickness detection means, for example, a contact-type measurement gauge 37. Here, since the initial thickness of the ring frame unit 104 (=thickness of the wafer 10) is preliminarily set to be slightly larger than the thickness of the chips 14 as described above, the ring frame unit 104 is first ground and thinned. Thereafter, the ring frame unit 104 is thinned to a predetermined thickness to coincide with the thickness of the chips 14, and the front surface 102b of the ring frame unit 104 and the back surfaces 14b of the chips 14 are simultaneously ground. When it has been detected that the thickness of the ring frame unit 104 measured by the measurement gauge 37 coincides with the finished thickness of the chips 14, the grinding unit 32 is stopped. Subsequently, through the cleaning and drying steps and the like, the processing step of grinding the chips 14 is completed, and the chip treating method of the present embodiment is completed. Note that, in the present embodiment, since the chips 14 and the ring frame unit 104 are formed from the same blank material, either one of them would not be partially ground, and variation in the thickness of the ring frame unit 104 and variation in the thickness of the chips 14 are coincident, which is convenient.

According to the chip processing method described above, since the ring frame unit 104 having the opening 102a is formed after the first tape T1 is affixed to the wafer 10 having no opening in a central part, the first tape T1 can be disposed without occurrence of twisting at the opening 102a of the ring frame unit 104, and the grinding of the chips 14 can be performed suitably.

Incidentally, in peeling off the central part 103 from the first tape T1 in the ring frame forming step of the above-described chip processing method according to the embodiment, the first tape T1 corresponding to the central part 103 of the wafer 10 may be irradiated with ultraviolet rays to lower the pressure sensitive adhesive force. In that case, even if the chips 14 are mounted on that region of the first tape T1 which has been irradiated with ultraviolet rays by the above-mentioned chip disposing step, it might be difficult to fix the chips 14 with a strength sufficient to such an extent as to endure the above-described grinding process. In that case, it is possible to cope with the situation by carrying out another embodiment including a chip transferring step described below.

Figure 4:
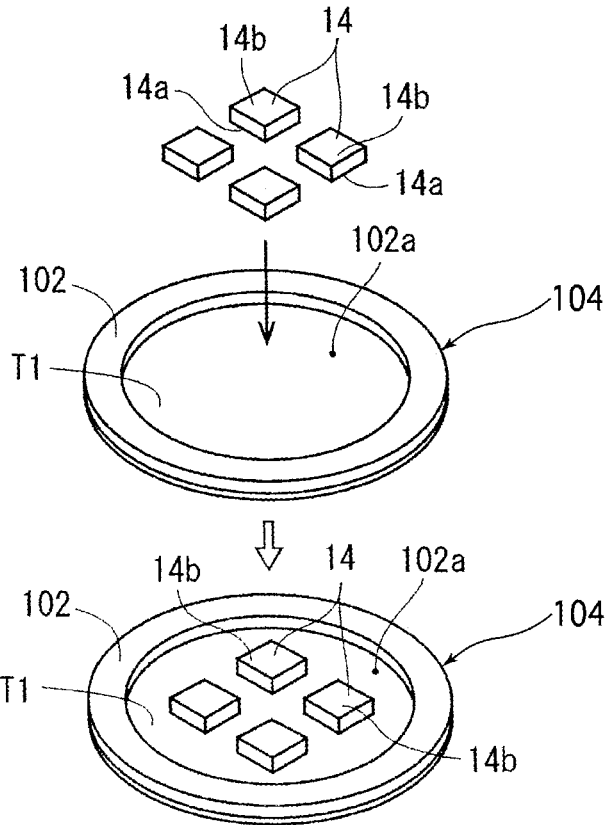
FIG. 4 is a perspective view depicting a chip disposing step according to an embodiment.

In another embodiment described below, also, the above-mentioned first tape affixing step described based on FIGS. 1 and 2 is carried out, to form the annular dividing groove 100. Then, prior to peeling off the central part 103 from the first tape T1 affixed to the wafer 10, that position of the first tape T1 affixed to the wafer 10 which corresponds to the central part 103 is irradiated with ultraviolet rays from the side where the first tape T1 is disposed, to lower the pressure sensitive adhesive force. Thereafter, the central part 103 is peeled off from the first tape T1, and the chip disposing step having been described based on FIG. 4 is carried out. Here, though not illustrated, in carrying out the chip disposing step in the embodiment including the chip transferring step, unlike the embodiment having been described based on FIG. 4, the chips 14 are mounted while the back surfaces 14b to be ground of the chips 14 are directed downward and the front surfaces 14a formed with the devices and the like are directed upward.

Next, prior to carrying out the processing step of processing the chips 14, there is conducted a second tape affixing step in which a second tape T2 is affixed in such a manner as to cover the ring frame unit 104 on the side where the chips 14 are disposed, to clamp the ring frame unit 104 between the first tape T1 and the second tape T2 in a sandwiching manner. The second tape affixing step will be described specifically with reference to FIGS. 6 and 7.

Figure 6:
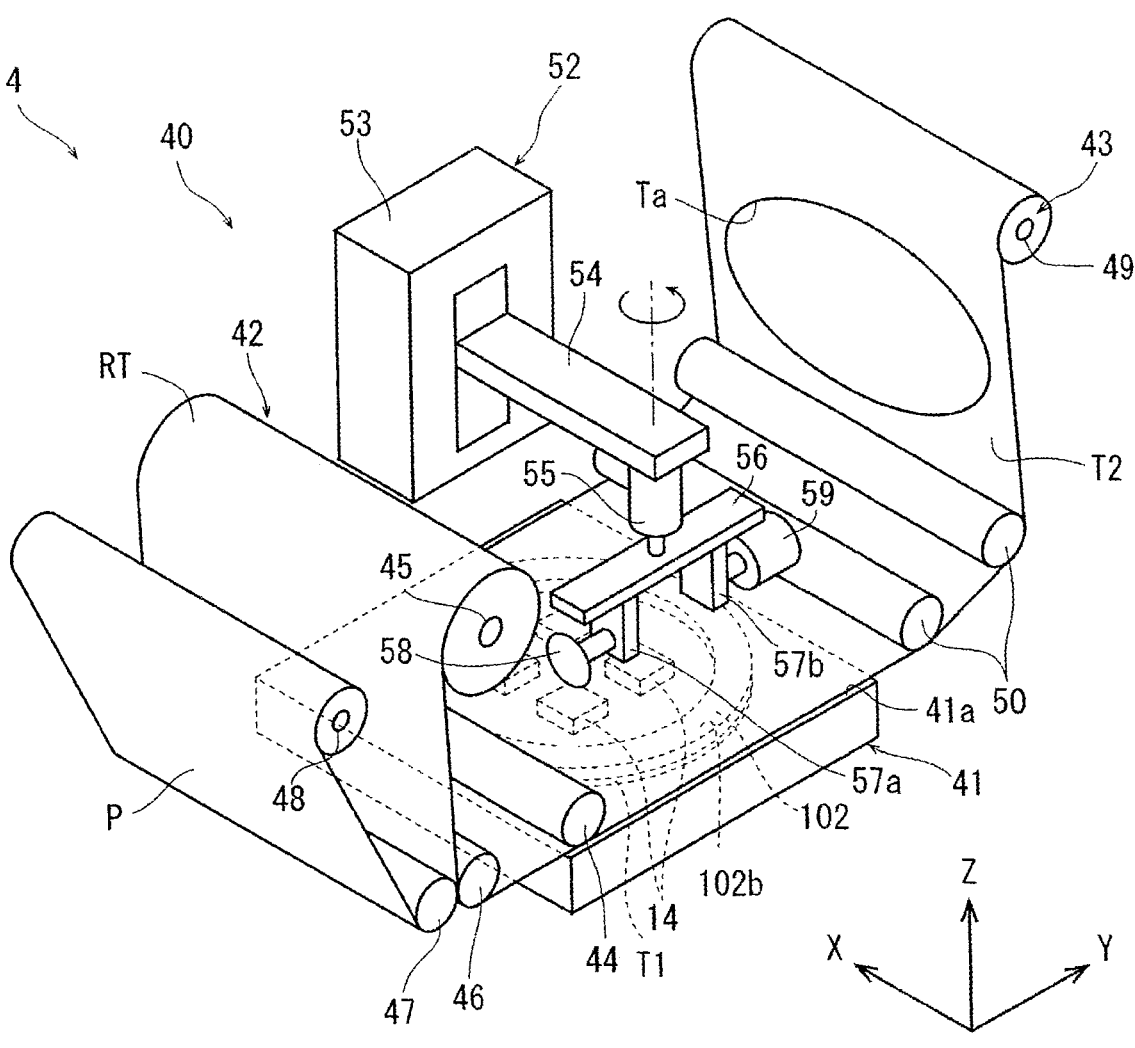
FIG. 6 is a general perspective view of a tape affixing apparatus.

In carrying out the second tape affixing step, a tape affixing apparatus 4 as depicted in FIG. 6, for example, can be used.

The tape affixing apparatus 4 includes a ring frame support table 41 for supporting the ring frame unit 104 with the chips 14 disposed thereon and a tape affixing unit 40 for affixing the second tape T2 to the ring frame unit 104. The ring frame support table 41 includes a support surface 41a on which to mount the ring frame unit 104 and unillustrated lifting means.

The tape affixing unit 40 includes a tape let-off section 42 for letting off the second tape T2; a tape take-up section 43 for taking up the residual second tape T2 after a desired range of the second tape T2 is affixed to the ring frame unit 104; and a press roller 44 which is disposed between the tape let-off section 42 and the tape take-up section 43 and which affixes the let-off second tape T2 to the ring frame unit 104 mounted on the support surface 41a of the ring frame support table 41, by moving from one end side toward the other end side of the ring frame unit 104 while pressing the second tape T2.

The tape let-off section 42 includes a support roller 45 for supporting a roll tape RT in which the second tape T2 before use is rolled in a cylindrical shape, a let-off roller 46 disposed on the lower side of the support roller 45, a motor (not illustrated) for rotating the let-off roller 46, and a driven roller 47 that is rotated attendant on the rotation of the let-off roller 46.

The tape let-off section 42 is configured to let off the second tape T2 clamped between the let-off roller 46 and the driven roller 47 from the roll tape RT by rotating the driven roller 47 together with the let-off roller 46 by the motor. In addition, from the second tape T2 passed between the let-off roller 46 and the driven roller 47, a release paper P is peeled off, and the peeled-off release paper P is taken up around a release paper roller 48 and recovered.

The tape take-up section 43 includes a take-up roller 49 for taking up the used second tape T2, an unillustrated motor for rotating the take-up roller 49, and a pair of guide rollers 50 disposed between the let-off roller 46 and the take-up roller 49.

In the tape take-up section 43, by rotating the take-up roller 49 by the motor, the used second tape T2 formed with a circular opening Ta corresponding to the part affixed to the ring frame unit 104 is taken up around the take-up roller 49 while being guided by the pair of guide rollers 50.

Figures 7, 8:
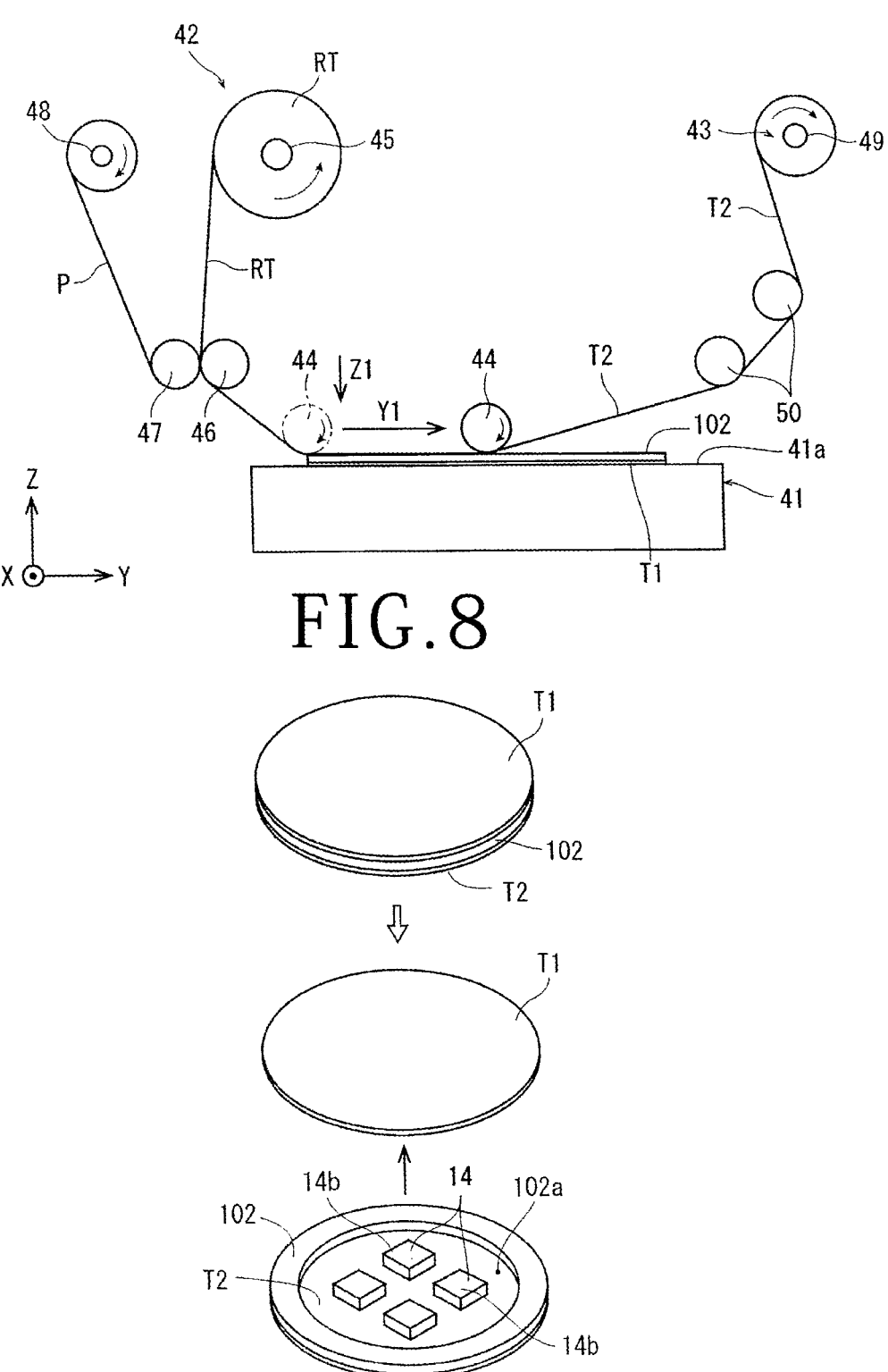
FIG. 7 is a side elevational view depicting a second tape affixing step according to an embodiment.
FIG. 8 is a perspective view depicting a chip transferring step according to an embodiment.

The press roller 44 is configured to be liftable and lowerable by the unillustrated lifting means, and, after being lowered to a pressing position in the direction indicated by an arrow Z1 in FIG. 7, is moved in the direction indicated by an arrow Y1 by unillustrated moving means in the state of pressing the second tape T2.

As depicted in FIG. 6, the tape affixing unit 40 includes a cutting mechanism 52 for cutting the second tape T2 protruding to the outer circumference side of the ring frame unit 104. The cutting mechanism 52 includes a lift guide member 53 erected in the vertical direction, a movable member 54 supported on the lift guide member 53, and unillustrated lifting means for lifting and lowering the movable member 54.

In addition, the above-mentioned cutting mechanism 52 includes a motor 55 fixed to a lower surface of a tip of the movable member 54 and an arm 56 rotated by the motor 55. On a lower surface of the arm 56, a first hanging piece 57a and a second hanging piece 57b are disposed to face each other with a spacing therebetween. On the first hanging piece 57a, a circular cutter 58 is disposed with a horizontal direction along the arm 56 as an axis, and, on the second hanging piece 57b, a press roller 59 held to be rotatable with a horizontal direction along the arm 56 as an axis is disposed.

The second tape T2 affixed to the ring frame unit 104 by the above-mentioned tape affixing apparatus 4 is, for example, a pressure sensitive tape provided with a pressure sensitive layer at a pressure sensitive surface, but the present invention is not limited to this, and a thermocompression adhesive sheet that has no pressure sensitive adhesive layer and that is affixed by thermocompression may be adopted.

The tape affixing apparatus 4 substantially has the above-described configuration, and a second tape affixing step carried out with use of the tape affixing apparatus 4 will be described below.

First, the ring frame unit 104 which has undergone the chip disposing step and in which the chips 14 are disposed on the first tape T1 exposed in the opening 102*a* is mounted on the support surface 41*a* of the ring frame support table 41. In mounting the ring frame unit 104 on the ring frame support table 41, the ring frame support table 41 is preliminarily lowered by unillustrated lifting means. The support surface 41*a* is provided with unillustrated positioning means, and the ring frame unit 104 is mounted on and fixed to a predetermined position. Besides, in this instance, the second tape T2 is let off from the roll tape RT, and the second tape T2 with the release paper P peeled off therefrom is in a state of tension without slackening, and is positioned on the upper side of the ring frame support table 41. Note that, in the present embodiment, a lower surface side of the second tape T2 is the pressure sensitive adhesive surface where the pressure sensitive adhesive layer is formed.

Next, the ring frame support table 41 is raised by the unillustrated controller, to be positioned at an affixing position depicted in FIG. 6. Subsequently, the press roller 44 is positioned to a compression start position indicated by a long dashed double-dotted line in FIG. 7, to apply tension to the second tape T2, and the second tape T2 is affixed to one end of the ring frame unit 104.

Next, while pressing the second tape T2 against the ring frame unit 104 and the chips 14, the press roller 44 is moved in the direction indicated by an arrow Y1 in FIG. 7. As a result, in a state in which uniform tension is applied to the second tape T2, the second tape T2 can be affixed to the ring frame unit 104 and the chips 14. Note that, in the case where the second tape T2 is a thermocompression adhesive tape, the second tape T2 is affixed in this instance while being heated by appropriate heating means.

When the second tape T2 has been affixed to the ring frame unit 104 as a whole and the chips 14, the above-mentioned lifting means of the cutting mechanism 52 is operated, to lower the cutter 58 and the press roller 59 of the cutting mechanism 52, the cutter 58 is pressed against the second tape T2 at a position corresponding to the outer circumference of the ring frame unit 104, and the ring frame unit 104 is pressed by the press roller 59 from an upper side of the second tape T2. Next, the arm 56 is rotated by the motor 55, the cutter 58 and the press roller 59 are rotated, and the cutter 58 and the press roller 59 are moved in such a manner as to draw a circle along the outer circumference of the ring frame unit 104. As a result, the second tape T2 can be cut along the outer circumference of the ring frame unit 104, while positional deviation of the second tape T2 is prevented. In this way, the used second tape T2 in which the circular second tape T2 is cut along the ring frame unit 104 to form the opening Ta is taken up around the tape take-up section 43 as described above. By the above operations, the second tape affixing step is completed, and, as depicted in an upper part of FIG. 8, the ring frame unit 104 is clamped between the first tape T1 and the second tape T2 in a sandwiched manner.

When the second tape affixing step is completed as described above, the ring frame unit 104 is taken out from the tape affixing apparatus 4, and, as depicted in FIG. 8, the first tape T1 is peeled off from a surface on one side of the ring frame unit 104 clamped in the sandwiched state. In this instance, ultraviolet rays may be applied from the first tape T1 side to lower the pressure sensitive adhesive force of the first tape T1. As a result, the chip transferring step of transferring the chips 14 onto the second tape T2 is completed, resulting in a state in which the chips 14 are disposed on the second tape T2 exposed in the opening 102*a* of the ring frame unit 104. Note that, as described above, in the present embodiment, since the chips 14 are disposed such that their back surfaces 14*b* are affixed to the first tape T1, peeling-off of the first tape T1 results in a state where the back surfaces 14*b* of the chips 14 which are the surfaces to be ground are exposed in the opening 102*a* of the ring frame unit 104, as depicted in FIG. 8. In other words, the same state as the state after the chip disposing step previously described based on FIG. 4 is carried out is obtained, so that the second tape T2 can be disposed without generation of twisting at the opening 102*a* of the ring frame unit 104, the chips 14 can suitably be disposed on the second tape T2, and processing of the chips 14 can suitably be carried out. Note that, though not described in particular, the above-mentioned tape affixing apparatus 4 can be used also in carrying out the first tape affixing step.

The present invention is not limited to the above-described embodiments. For example, while it has been described in the above embodiments that grinding of the ring frame unit 104 and the back surfaces 14*b* of the chips 14 is carried out after the chip disposing step or the chip transferring step is conducted, the present invention is not limited to this; for example, processing of polishing the ring frame unit 104 and the back surfaces 14*b* of the chips 14 may be adopted.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A chip treating method of disposing a chip in an opening of a ring frame having the opening in a center of the ring frame, through a tape, the chip treating method comprising:

a first tape affixing step of affixing a first tape to a wafer;

after the first tape affixing step, a ring frame unit forming step of removing a central part of the wafer to form a ring frame unit having the opening and exposing the first tape in the opening; and a chip disposing step of disposing the chip on the first tape exposed in the opening of the ring frame unit.

2. The chip treating method according to claim 1, further comprising:

after the chip disposing step, a second tape affixing step of affixing a second tape on a side where the chip is disposed, in such a manner as to cover the ring frame of the ring frame unit, thereby clamping the ring frame between the first tape and the second tape in a sandwiching manner; and a chip transferring step of peeling off the first tape to transfer the chip onto the second tape.

3. The chip treating method according to claim 2, further comprising:

a processing step of processing the chip, after the chip transferring step.

4. The chip treating method according to claim 3, wherein the processing step is a step of carrying out a grinding process of grinding the chip.

5. The chip treating method according to claim 1, wherein a blank material of the wafer and a blank material of the chip are the same.

6. The chip treating method according to claim 1, wherein, in the ring frame unit forming step, a cutting blade or a laser beam is positioned along an outline of the opening to be formed, and the outline is cut to form the opening.

7. The chip treating method according to claim 1, further comprising:

a processing step of processing the chip, after the chip disposing step.

8. The chip treating method according to claim 7, wherein the processing step is a step of carrying out a grinding process of grinding the chip.

9. The chip treating method according to claim 1, wherein, in the ring frame unit forming step, a part of the first tape corresponding to the central part of the wafer is irradiated with ultraviolet rays.

* * * * *